United States Patent

Predina et al.

[11] Patent Number: 4,598,217
[45] Date of Patent: Jul. 1, 1986

[54] HIGH SPEED PHASE/FREQUENCY DETECTOR

[75] Inventors: Joseph P. Predina; Tim H. Roberts, both of Fort Wayne, Ind.

[73] Assignee: ITT Corporation, New York, N.Y.

[21] Appl. No.: 591,281

[22] Filed: Mar. 19, 1984
(Under 37 CFR 1.47)

[51] Int. Cl.[4] .............................................. H03K 9/06
[52] U.S. Cl. ................................. 307/525; 328/133
[58] Field of Search ............... 307/525, 526, 523, 516; 328/133, 134

[56] References Cited

U.S. PATENT DOCUMENTS 4,378,509 3/1983 Hatchett et al. .................... 307/526

Primary Examiner—Stanley D. Miller
Assistant Examiner—Karl Ohralik
Attorney, Agent, or Firm—John T. O'Halloran

[57] ABSTRACT

A phase/frequency detector to detect the phase/frequency difference between two signals comprises a first bistable circuit to produce a first output pulse in response to one of the two signals; a second bistable circuit to produce a second output pulse in response to the other of the two signals; a gate circuit coupled to the first and second bistable circuits responsive to the first and second output pulses to produce a reset pulse to reset the first and second bistable circuits after a predetermined time delay. A first circuit arrangement is coupled to the first bistable circuit and the gate circuit to reduce the width of the first output pulse and a second circuit arrangement is coupled to the second bistable circuit and the gate circuit to reduce the width of and invert the second output pulse. The second circuit arrangement includes a third circuit arrangement to equalize turn on and turn off times of the reduced width first output pulse and the reduced width second output pulse. A high speed switching arrangement is coupled to the first and the second circuit arrangements and a constant current arrangement for high speed switching of current into one of two electrical loads. An arrangement is provided, coupled to the constant current arrangement, to enable programming of the switched current. The detector further includes a level shifting arrangement to shift the reduced width first output pulse to a level of higher electrical potential to extend the voltage swing of the output voltage of the detector provided by the switching means.

26 Claims, 4 Drawing Figures

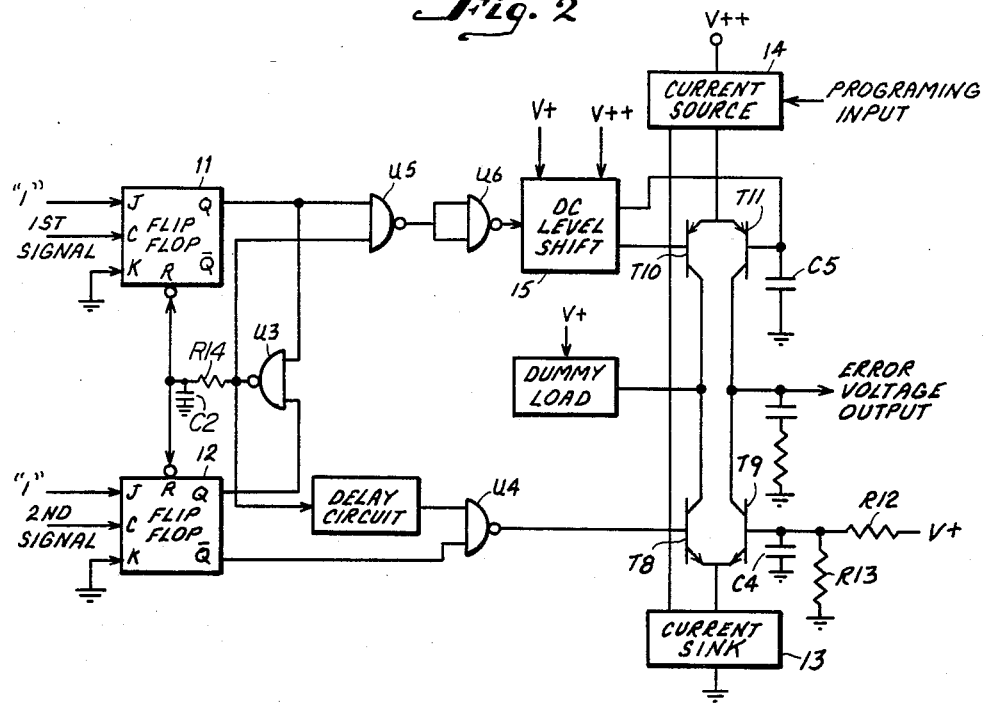
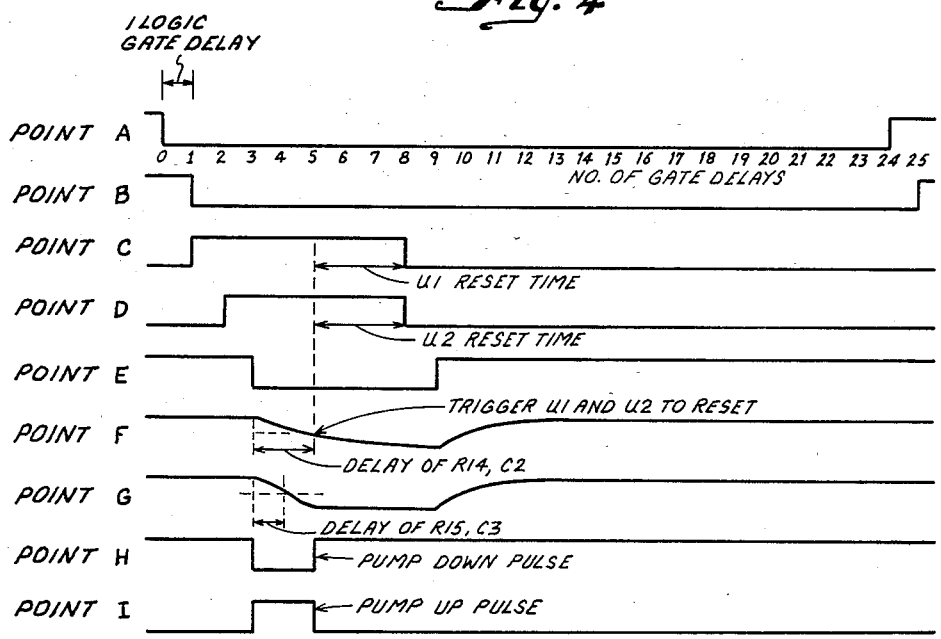

HIGH SPEED PHASE/FREQUENCY DETECTOR

BACKGROUND OF THE INVENTION

The present invention relates to phase/frequency detectors and more particularly to an improved high speed phase/frequency detector.

Conventional phase/frequency detectors of the prior art used two bistable circuits, such as flip-flops, to detect the leading edges of first and second input signals applied thereto, such as a reference clock signal and a feedback pulse train found in phase locked loop circuit arrangements. The pulses out of the bistable circuits control respective intermediate transistor switching stages which switch constant current sources or current sinks off and on. This constitutes a charge pump arrangement which causes the current to be pumped into a storage device, such as a capacitor, and removed from the storage device, dependent upon the control pulses from the bistable circuits so as to produce an output voltage across the capacitor which is proportional to the phase or frequency difference between the first and second input signals. A reset pulse from a gate circuit, such as a NAND gate, is coupled to the bistable circuit outputs and is used to reset the bistable circuit immediately after both bistable circuits have been triggered on.

The problems with this type of phase/frequency detector and charge pump arrangement of the prior art are:

(1) Minimum reset pulse width to the charge pumps from the NAND gate is determined by the width necessary to reset both bistable circuits or flip-flops or the turn on/off times of the charge pumps. The minimum pulse width usually is too long and excessive clock feedthrough to the charge pumps' output occurs.

(2) Switching time of the single transistor charge pumps is slow (tens of nanoseconds) thus limiting the phase detectors' use to clock frequencies below one MHz (megahertz).

(3) The charge pump balance is set initially by a potentiometer in one of the switching arrangements. However, the current balance varies with temperature, supply voltage changes and mismatches of the turn on/off time constants of the switches. The resulting mismatch results in excessive clock feedthrough.

(4) There exists no convenient way of programming different currents without possibly upsetting charge pump balance or the on/off time constants of the charge pump switches. Without this balance, excessive clock feedthrough results.

(5) The circuit of the prior art must have its level shifting circuitry specially tailored with "speed up" capacitors to enhance the charge pump's switching speed. The tailored value must be changed for different phase detector gains and is somewhat temperature dependent.

(6) Noise appearing on the charge pump power supply is not isolated from the charge pump output.

SUMMARY OF THE INVENTION

An object of the present invention is to provide an improved phase/frequency detector.

Another object of the present invention is to provide an improved phase/frequency detector overcoming or reducing the disadvantages of the prior art arrangements as outlined hereinabove under the heading "Background of the Invention".

A feature of the present invention is the provision of a phase/frequency detector to detect the phase/frequency difference between two signals comprising: first bistable means clocked by one of the two signals to produce a first output pulse; second bistable means clocked by the other of the two signals to produce a second output pulse; gate means coupled to the first and second bistable means responsive to the first and second output pulses to produce a reset pulse to reset the first and second bistable means after a first predetermined time delay; first means coupled to the first bistable means and the gate means to reduce the width of the first output pulse; and second means coupled to the second bistable means and the gate means to reduce the width of and invert the second output pulse.

Another feature of the present invention is the provision of a third means in the second means to equalize the turn on and turn off times of the reduced width first output pulse and the reduced width second output pulse.

Still another feature of the present invention is the provision of high speed switching means in the form of two differential transistor pairs coupled to the first and second means and a constant current means responsive to the reduced width of the first output pulse and the reduced width second output pulse for high speed switching of current into one of two electrical loads.

A further feature of the present invention is the provision of fourth means coupled to the constant current means to enable programming of the current switched into one of the two electrical loads.

Still a further feature of the present invention is the provision of level shifting means coupled between the first means and the switching means to shift the reduced width first output pulse to a level of higher electrical potential to extend the voltage swing of an output voltage of the detector provided by the switching means.

The new and improved phase/frequency detector disclosed herein uses differential pair transistors to improve charge pump switching speed and to reduce clock feedthrough. This arrangement permits higher clock rates, and provides shorter control pulse widths and quicker and more accurate charge pumps. A low impedance "fast" DC (direct current) level shifter makes possible charge pump output voltage swings which greatly exceed the logic circuit's power supply range. The DC level shift is adaptive without the need to change any circuitry components. This gives the design great flexibility in the charge pump power supply voltage. Propagation delays in the charge up and charge down pulses have been equalized so that feedthrough of the clock signal is minimized by cancellation of charge up and charge down currents. A constant current source and current sink is corporated into the detector of the present invention in such a way that the current sources and current sinks very accurately track each other. The tracking is achieved for a wide range of electrically programmed current levels thus allowing cancellation of clock feedthrough irrespective of the phase/frequency detector's gain. The tracking current source and current sink also result in cancellation of noise signals which may appear on the charge pump's power supply.

BRIEF DESCRIPTION OF THE DRAWING

FIG. 2 is a block diagram of the improved phase/frequency detector with charge pump in accordance with the principles of the present invention;

FIG. 4 is a diagram illustrating the waveforms at various points in the circuit of FIG. 3 identified in both FIG. 3 and FIG. 4 by letters.

DESCRIPTION OF THE PREFERRED EMBODIMENT

Figure 1:
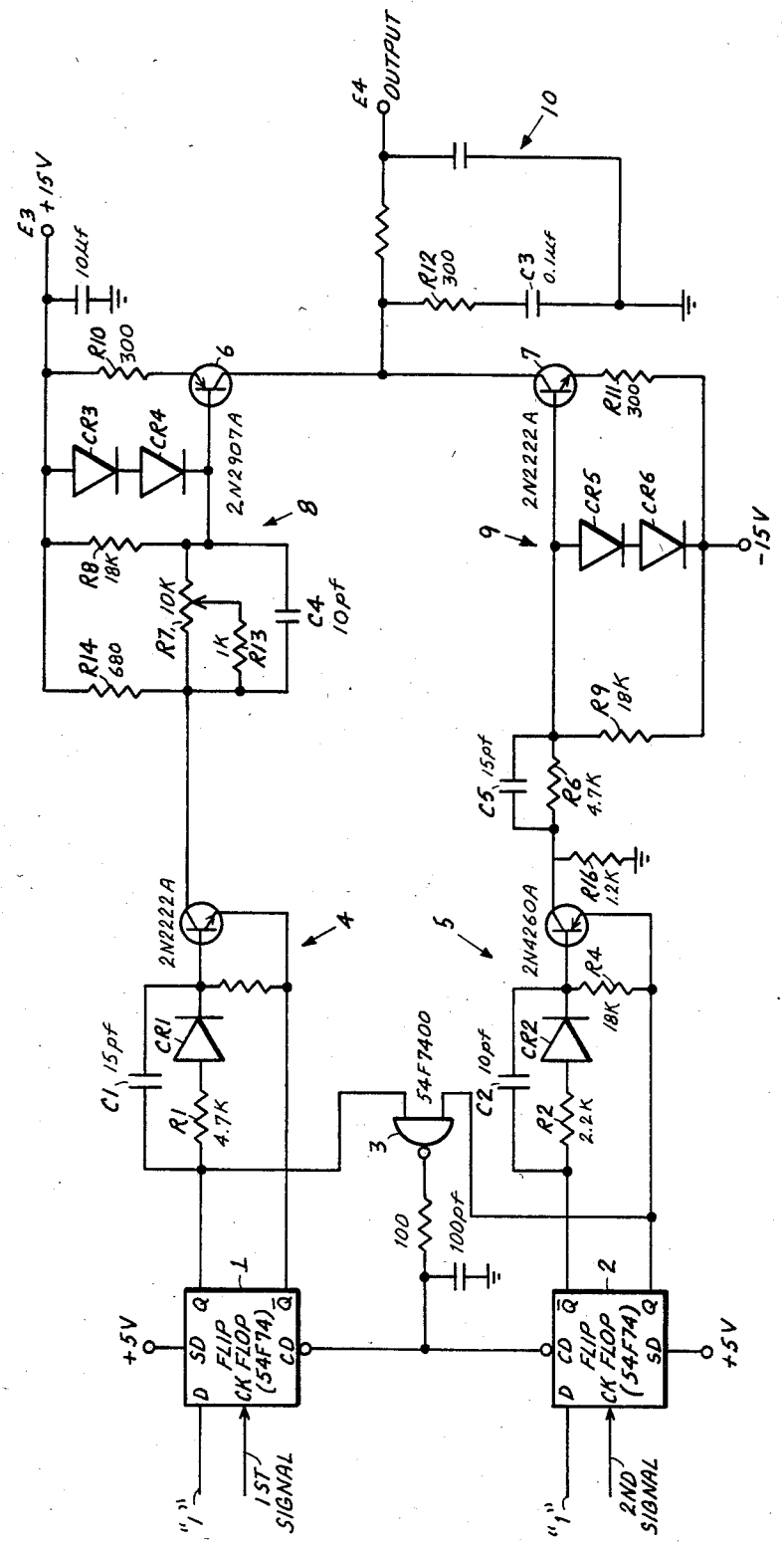
FIG. 1 is a schematic diagram of a prior art phase/frequency detector employing a charge pump arrangement.

Referring to FIG. 1, the prior art phase/frequency detector mentioned hereinabove under the heading "Background of the Invention" includes two flip-flops 1 and 2 with flip-flop 1 responding to a first signal, such as a reference signal in a phase locked loop, and flip-flop 2 responding to a second signal, such as the feedback signal in a phase locked loop. The Q outputs of the flip-flops 1 and 2 are coupled to a NAND gate 3 to reset the flip-flops 1 and 2 after the flip-flops have been triggered by the first and second signals. The control pulse outputs of flip-flops 1 and 2 are also coupled to DC level shifters 4 and 5 and, hence, to a current source switching circuit including the single transistors 6 and 7. The currents provided by current source switching transistor 6 and current sink switching transistor 7 are switched into or out of the storage arrangement under control of the control pulse outputs of flip-flops 1 and 2.

Figure 3:
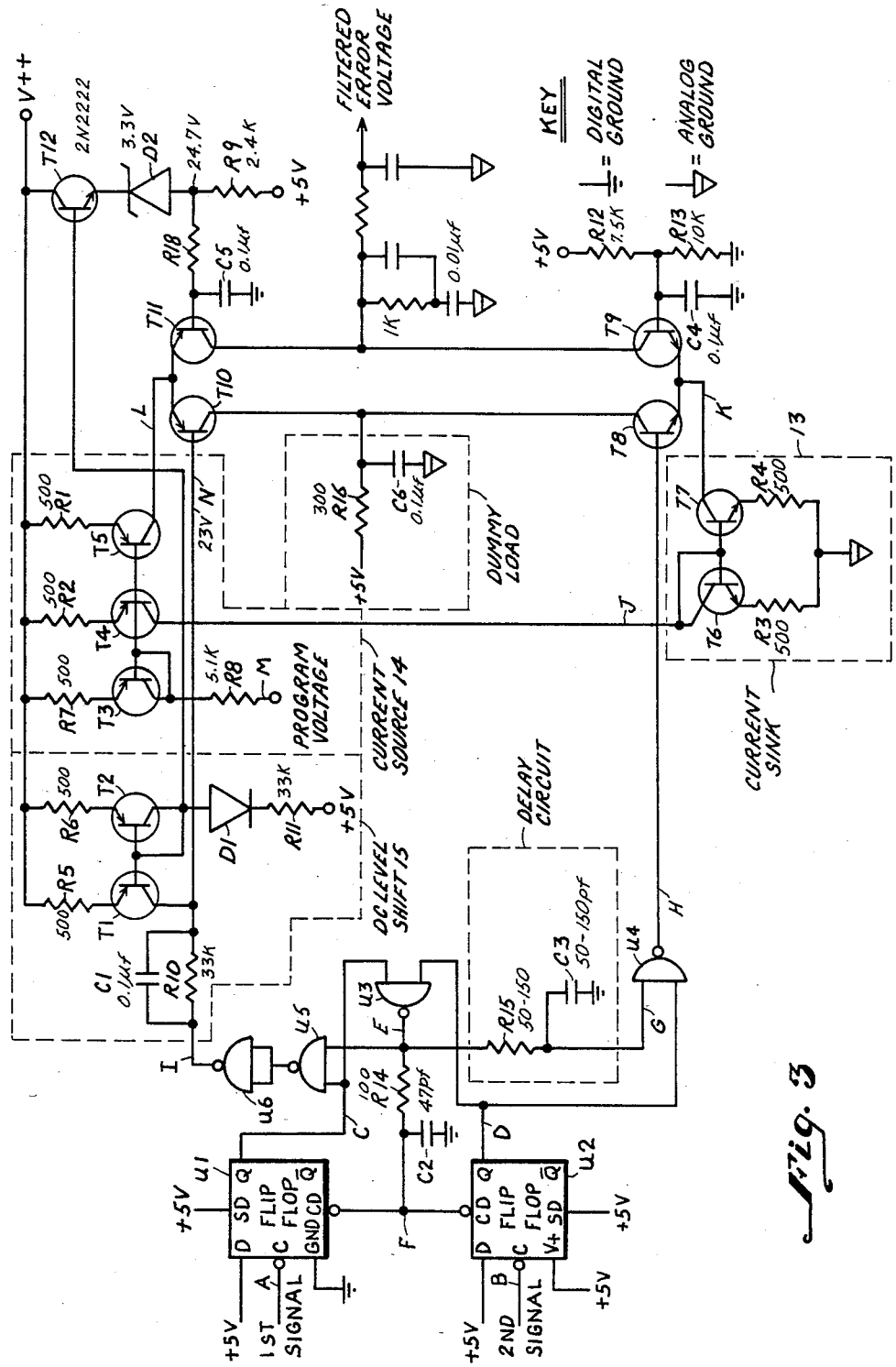
FIG. 3 is a schematic diagram of the phase/frequency detector of FIG. 2.

Referring to FIGS. 2 and 3, the improved phase/frequency detector of the present invention is shown to include either JK flip-flops 11 and 12 as indicated in the block diagram of FIG. 2, or D type flip-flops as illustrated by flip-flops U1 and U2 of the schematic diagram of FIG. 3. The waveforms at various points at FIG. 3 are shown in FIG. 4 and are identified by the letter corresponding to the letter employed for each waveform of FIG. 4. The clock input of flip-flop U1 of FIG. 3 or flip-flop 11 of FIG. 2 receives a clock as illustrated in curve A of FIG. 4 which triggers the flip-flop U1 or 11 such that the flip-flop's Q output goes to a logic high state. Similarly, flip-flop U2 of FIG. 3 or flip-flop 12 of FIG. 2 is triggered by a signal on the clock input, such as illustrated in curve B of FIG. 4, to produce the same logic high output at the Q terminal thereof. Shortly after both of the flip-flops U1 and U2 (11 and 12) have been set high, a reset pulse is generated at the output of NAND gate U3 and applied to the reset input of flip-flops U1 and U2 (11 and 12) after passing through a resistor-capacitor circuit formed by resistor R14 and capacitor C2. The reset pulse resets both flip-flops to a logic low state. The time delay between the arrival of the reset pulse and a logic high output from both flip-flops U1 and U2 (11 and 12) is determined by the delay through logic gate U3 and the delay created by the network including resistor R14 and capacitor C2.

The circuitry of flip-flops U1 and U2, the logic gate U3 and resistor R14 and capacitor C2 represent the prior art in which the Q outputs of flip-flops U1 and U2 must have some minimum pulse width determined by the time delays through gate U3, resistor R14, capacitor C2 and the propagation delay of a reset pulse at the reset inputs through the flip-flops U1 and U2 to their corresponding Q outputs.

The present invention substantially reduces the pulse widths by the addition of the logic gates in the form of NAND gates U4, U5, and U6 and the delay network resistor R15 and capacitor C3. Resistor R15 and capacitor C3 are chosen such that the delay through this network is equal to the nominal delay through a logic gate, such as NAND gate U6.

When the present invention is used as a phase detector in a phase locked loop comprising a voltage controlled oscillator, a divide-by-N feedback counter and a reference clock, the frequency of the clock pulses on the clock inputs of flip-flops U1 and U2 of FIG. 3 and flip-flops 11 and 12 of FIG. 2 would be identical. In the steady state locked case, the phase difference between the clock pulses on the clock input of the flip-flop U1 (11) and on the clock input of flip-flop U2 (12) correspond to one logic gate delay as would be incurred through a logic gate, such as gate U6. FIG. 4 shows the timing relationship between the input signals at points A and B and the output signals at points C, D, E, F, G, H, and I. It should be noted that by proper adjustment of resistor R15 and capacitor C3 the delay through this network can be used to align the pulse widths which appear at points H and I.

The control voltage at point H is used to drive a differential amplifier switch comprising differential amplifier transistor pair T8 and T9, capacitor C4 and resistors R12 and R13. When the voltage at the base of transistor T8 is substantially greater than the voltage at the base of transistor T9, then transistor T8 is "on" while transistor T9 is "off". In a similar manner, when the voltage at the base of transistor T9 is greater than the voltage at the base of transistor T8, transistor T9 is "on" while transistor T8 is "off". The threshold voltage at the base of transistor T9 is determined by the values of resistors R12 and R13. This value would normally be adjusted so that it is midway between the minimum and maximum voltage swing at the base of transistor T8. Capacitor C4 stabilizes the voltage at the base of transistor T9 and substantially reduces clock feedthrough transients originating from point H.

A constant current sink 13 is connected to the emitters of transistors T8 and T9 and includes transistors T6 and T7 and resistors R3 and R4. When resistors R3 and R4 are substantially equal, then the current as measured at point J is substantially equal to the current as measured at point K.

A dual programmable current source 14 includes transistors T3, T4 and T5 and resistors R1, R2, R7 and R8. When the resistors R1, R2 and R7 are substantially equal to each other, then the currents flowing out of the emitters of each of the transistors T3, T4 and T5 are also substantially equal to each other. The exact value of current is programmable by changing the voltage at point M or by changing the value of resistor R8 while the voltage at point M remains constant. Since the current originating from the collector of transistor T4 is equal to the current injected into point J of the current sink 14, then the current injected at point L is substantially equal to the current measured at point K. If resistors R1, R2, R3, R4 and R7 are also of substantially equal value, one skilled in the art can easily recognize that the mismatch of currents measured at points K and L is directly related to the mismatch occurring between resistors R1, R2, R3 and R4. The mismatch is also affected to a substantially lesser extent by mismatches of the base to emitter voltage drops between transistors T4, T5, T6 and T7. It should further be recognized that a change in the value of voltage V++ will change the value of current measured at points K and L equally. This represents a substantial improvement over the prior art since small disturbances caused by noise on the V++ power supply causes variations in the currents at the points K and L that cancel at the output of the charge pump when transistors T9 and T11 are both "on".

A second differential pair transistor amplifier switch including transistors T10 and T11, capacitor C5, resistors R9 and R18, and diode D2 of the Zener type provides switching of the current injected into point L. Operation of this current switch is similar to that described for the operation of transistors T8 and T9. The reference voltage at the base of transistor T11 is developed by the Zener diode D2 and the bias resistor R9. This configuration permits operation of differential current switch T10 and T11 at a switching voltage somewhat near the voltage V++ in value. As a result of this biasing technique, the circuit is capable of operating over a wide range of V++ power supply voltages and provides an output which also can swing over a very large range of voltages. Capacitor C5 like capacitor C4 is used to help suppress clock feedthrough as a result of very fast and very high level voltage swings of the base of transistor T10. Resistor R18 provides noise isolation between the digital ground of capacitor C5 and the V++ power supply. The value of resistor R18 is usually chosen small so as not to effect the bias voltage at the base of transistor T11.

Since the threshold of voltage appearing at the base of transistor T11 is substantially greater than the switching control voltage appearing at point I then the switching signal at point I must be appropriately level shifted to a potential suitable for switching transistors T10 and T11 "on" and "off". This is accomplished by the DC level shift network 15 including transistors T1 and T2, resistors R5, R6, R10 and R11, diode D1 and capacitor C1. Transistors T1 and T2 are configured as a current source where the current flowing into the emitter of transistor T2 is determined by the power supply voltage V++, the logic supply voltage at point N, resistors R6 and R11 and the voltage drop across diode D1. If resistor R5 is chosen substantially equal to resistor R6, then the current flowing into the emitters of transistors T1 and T2 are also substantially equal. Furthermore, if resistors R10 and R11 are chosen substantially equal, then the voltage drop across resistor R10 is also substantially equal to the voltage drop across resistor R11. The transistor follower T12 is configured such that the voltage at the emitter of transistor T12 tracks the voltage at the cathode of diode D1. As previously mentioned, the Zener diode D2 is selected to provide thresholding midway between the minimum and maximum voltage appearing at the base of transistor T10. Note that the base of transistor T11 is 1.7 volts higher than transistor 10 when the output of gate U6 is at a logic low. Capacitor C1 stabilizes the voltage drop across resistor R10 and presents a substantial low impedance to drive transistor T10 "on" and "off". The exact value of capacitor C1 is not critical and is chosen so as to be substantially larger than the capacitance seen from point N to ground or from point N to V++.

As pointed out hereinabove, past phase/frequency detectors have exhibited several performance limitations. The new phase/frequency detector disclosed herein and tested provides electrical programmability of phase detector gain and uses non-saturating differential amplifier transistor pairs for fast turn "on" and "off" of the current pumps. In addition to the ability of operating at a higher clock rate, the circuit arrangement incorporates special means for suppressing clock feedthrough and is capable of operating over wide ranges of power supply voltages.

While we have described above the principles of our invention in connection with specific apparatus, it is to be clearly understood that this description is made only by way of example and not as a limitation to the scope of our invention as set fourth in the objects thereof and in the accompanying claims.

We claim:

1. A phase/frequency detector to detect the phase/frequency difference between two signals comprising:
   first bistable means clocked by one of said two signals to produce a first output pulse;
   second bistable means clocked by the other of said two signals to produce a second output pulse;
   gate means coupled to said first and second bistable means responsive to said first and second output pulses to produce a reset pulse to reset said first and second bistable means after a first predetermined time delay;
   first means coupled to said first bistable means and said gate means to reduce the width of said first output pulse; and,
   second means coupled to said second bistable means and said gate means to reduce the width of and invert said second output pulse, said second means including
   third means to equalize turn on and turn off times of said reduced width first output pulse and said reduced width second output pulse.

2. A detector according to claim 1, wherein
   said first bistable means includes a first D-type flip-flop providing said first output pulse at its Q output,
   said second bistable means includes a second D-type flip-flop providing said second output pulse at its Q output,
   said gate means includes a first NAND gate coupled to said Q output of each of said first and second flip-flops and a first resistor-capacitor circuit coupled between an output of first NAND gate and a reset input of each of said first and second flip-flops,
   said first means includes a second NAND gate coupled to said Q output of said first flip-flop and said output of said first NAND gate and a third NAND gate coupled to an output of said second NAND gate,
   said second means includes a fourth NAND gate having a first input coupled to said Q output of said second flip-flop and
   said third means includes a second resistor-capacitor circuit coupled between said output of said first NAND gate and a second input of said fourth NAND gate.

3. A detector according to claim 1, further including high speed switching means coupled to said first and second means and a constant current means responsive to said reduced width first output pulse and said reduced width second output pulse for high speed switching of current into one of two electrical loads.

4. A detector according to claim 3, wherein
   said current means includes a first source of constant current and a constant current sink connected to said first source of constant current to produce substantially equal source and sink currents, and said switching means includes a first differential transistor pair coupled to said first means, said first source of current and said two loads and a second differential transistor pair coupled to said first transistor pair, said second means, the current sink and said two electrical loads.

5. A detector according to claim 4, further including fourth means coupled to said first source of current to enable programming of said current.

6. A detector according to claim 3, further including fourth means coupled to said constant current means to enable programming of said current.

7. A detector according to claim 3, further including level shifting means coupled between said first means and said switching means to shift said reduced width first output pulse to a level of higher electrical potential to extend the voltage swing of an output voltage of said detector provided by said switching means.

8. A detector according to claim 4, further including level shifting means coupled between said first means and said first transistor pair to shift said reduced width first output pulse to a level of higher electrical potential to extend the voltage swing of an output voltage of said detector provided by said switching means.

9. A detector according to claim 8, wherein said level shifting means includes a second source of current having a pair of interconnected matched transistors and a pair of matched resistors connected to said matched transistors so that any incremental change in voltage of a first power supply coupled to said level shifting means results in the same incremental change of direct voltage level at the bases of said first transistor pair.

10. A detector according to claim 9, wherein said level shifting means further includes fifth means connecting said second source of current to said first power supply and to a second power supply providing a voltage less than said first power supply, said fourth means produces said level shift so that said reduced width first output pulse has a value substantially equal to said voltage of said first power supply.

11. A detector according to claim 10, wherein said fifth means includes
a first resistor coupled between said first means and said second source of current,
a transistor coupled to said first power supply and said second source of current,
a Zener diode coupled between said transistor and said first transistor pair,
a diode connected between said second source of current and said second power supply, and
a second resistor coupled between said Zener diode and said second power supply.

12. A detector according to claim 11, wherein said fifth means further includes a capacitor having a relatively large value coupled in parallel with said first resistor to substantially increase the switching speed of said matched transistor pair.

13. A detector according to claim 12, wherein said switching means further includes a first capacitor coupled to said first transistor pair and a second capacitor coupled to said second transistor pair to suppress switching noise related to the frequency of said two signals.

14. A detector according to claim 4, wherein said switching means further includes a first capacitor coupled to said first transistor pair and a second capacitor coupled to said second transistor pair to suppress switching noise related to the frequency said two signals.

15. A phase/frequency detector to detect the phase/frequency difference between two signals comprising:
first bistable means clocked by one of said two signals to produce a first output pulse;
second bistable means clocked by the other of said two signals to produce a second output pulse;
gate means coupled to said first and second bistable means responsive to said first and second output pulses to produce a reset pulse to reset said first and second bistable means after a first predetermined time delay;
first means coupled to said first bistable means and said gate means to reduce the width of said first output pulse;
second means coupled to said second bistable means and said gate means to reduce the width of and invert said second output pulse; and
high speed switching means coupled to said first and second means and a constant current means responsive to said reduced width first output pulse and said reduced width second output pulse for high speed switching of current into one of two electrical loads.

16. A detector according to claim 15, wherein said current means includes a first source of constant current and a constant current sink connected to said first source of constant current to produce substantially equal source and sink currents, and
said switching means includes a first differential transistor pair coupled to said first means, said first source of current and the two electrical loads and a second differential transistor pair coupled to said first transistor pair, said second means, said current sink and said two loads.

17. A detector according to claim 16, further including
fourth means coupled to said first source of current to enable programming of said current.

18. A detector according to claim 15, further including
fourth means coupled to said constant current means to enable programming of said current.

19. A detector according to claim 15, further including
level shifting means coupled between said first means and said switching means to shift said reduced width first output pulse to a level of higher electrical potential to extend the voltage swing of an output voltage of said detector provided by said switching means.

20. A detector according to claim 16, further including
level shifting means coupled between said first means and said first transistor pair to shift said reduced width first output pulse to a level of higher electrical potential to extend the voltage swing of an output voltage of said detector provided by said switching means.

21. A detector according to claim 20, wherein said level shifting means includes a second source of current having a pair of interconnected matched transistors and a pair of matched resistors connected to said matched transistors so that any incremental change in voltage of a first power supply coupled to said level shifting means results in the same incremental change of direct voltage level at the bases of said first transistor pair.

22. A detector according to claim 21, wherein said level shifting means further includes fifth means connecting said second source of current to said first power supply and to a second power supply providing a voltage less than said first power supply, said fourth means produces said level shift so that said reduced width first output pulse has a value substantially equal to said voltages of said first power supply.

23. A detector according to claim 22, wherein said fifth means includes
   a first resistor coupled between said first means and said second source of current,
   a transistor coupled to said first power supply and said second source of current,
   a Zener diode coupled between said transistor and said first transistor pair,
   a diode connected between said second source of current and said second power supply, and
   a second resistor coupled between said Zener diode and said second power supply.

24. A detector according to claim 23, wherein said fifth means further includes a capacitor having a relatively large value coupled in parallel with said first resistor to substantially increase the switching speed of said matched transistor pair.

25. A detector according to claim 24, wherein said switching means further includes a first capacitor coupled to said first transistor pair and a second capacitor coupled to said second transistor pair to suppress switching noise related to the frequency of said two signals.

26. A detector according to claim 16, wherein said switching means further includes a first capacitor coupled to said first transistor pair and a second capacitor coupled to said second transistor pair to suppress switching noise related to the frequency of said two signals.

* * * * *